United States Patent
Ichimaru

(10) Patent No.: US 6,593,783 B2
(45) Date of Patent: Jul. 15, 2003

(54) COMPENSATION CIRCUIT FOR FRACTIONAL-N FREQUENCY PLL SYNTHESIZER

(75) Inventor: Kouzou Ichimaru, Kunisaki-machi (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/776,510

(22) Filed: Feb. 2, 2001

(65) Prior Publication Data

US 2002/0196060 A1 Dec. 26, 2002

(30) Foreign Application Priority Data

Feb. 2, 2000 (JP) ........................................ 2000-024940

(51) Int. Cl.[7] .............................................. H03L 7/06
(52) U.S. Cl. ......................................... 327/156; 331/17
(58) Field of Search ................................ 327/105, 155, 327/156, 157, 159, 160; 375/374–376; 331/DIG. 2, 17

(56) References Cited

U.S. PATENT DOCUMENTS

| | | | | |
|---|---|---|---|---|
| 5,517,685 A | * | 5/1996 | Aoyama et al. | ............... 331/11 |
| 6,064,272 A | * | 5/2000 | Rhee | ........................... 327/158 |
| 6,169,457 B1 | | 1/2001 | Ichimaru | |
| 6,236,275 B1 | * | 5/2001 | Dent | ............................. 327/106 |
| 6,249,685 B1 | * | 6/2001 | Sharaf et al. | ................. 327/148 |
| 6,388,536 B1 | * | 5/2002 | Welland | ........................ 327/107 |

FOREIGN PATENT DOCUMENTS

JP      09(1997)-279970       9/1997

* cited by examiner

Primary Examiner—My-Trang Nu Ton
(74) Attorney, Agent, or Firm—William B. Kempler; W. James Brady, III; Frederick J. Telecky, Jr.

(57) ABSTRACT

Frequency synthesizer (1) has compensation circuit (45) and correction circuit (10). Compensation circuit (45) has compensation capacitor (46), while correction circuit (10) has detection capacitor (23). Correction circuit (10) charges/discharges detection capacitor (23) corresponding to the control signal of the PLL loop to generate a reference voltage. Compensation circuit (45) applies a voltage to compensation capacitor (46) on the basis of the reference voltage to cancel the ripple current included in the control signal. By making the time for charging/discharging detection capacitor (23) equal to one period of a comparison signal obtained by dividing the frequency of the external output signal of the PLL loop, it is possible to generate a reference voltage which can follow changes in the external output signal. Consequently, the ripple current can be correctly cancelled out by following the changes in the external output signal.

10 Claims, 5 Drawing Sheets

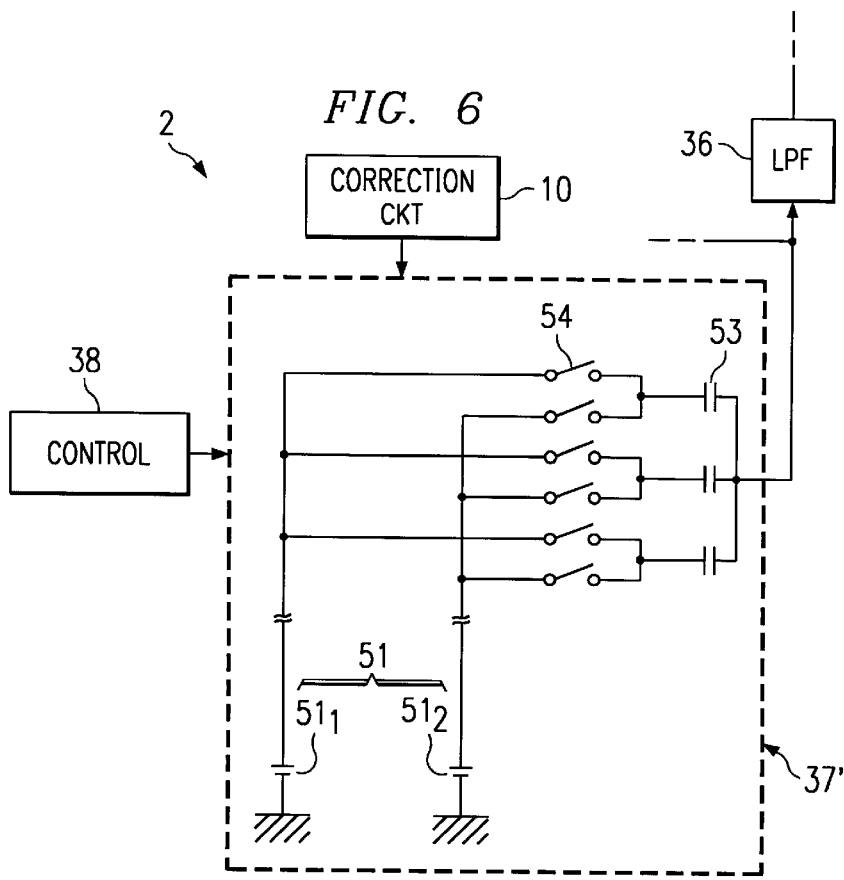
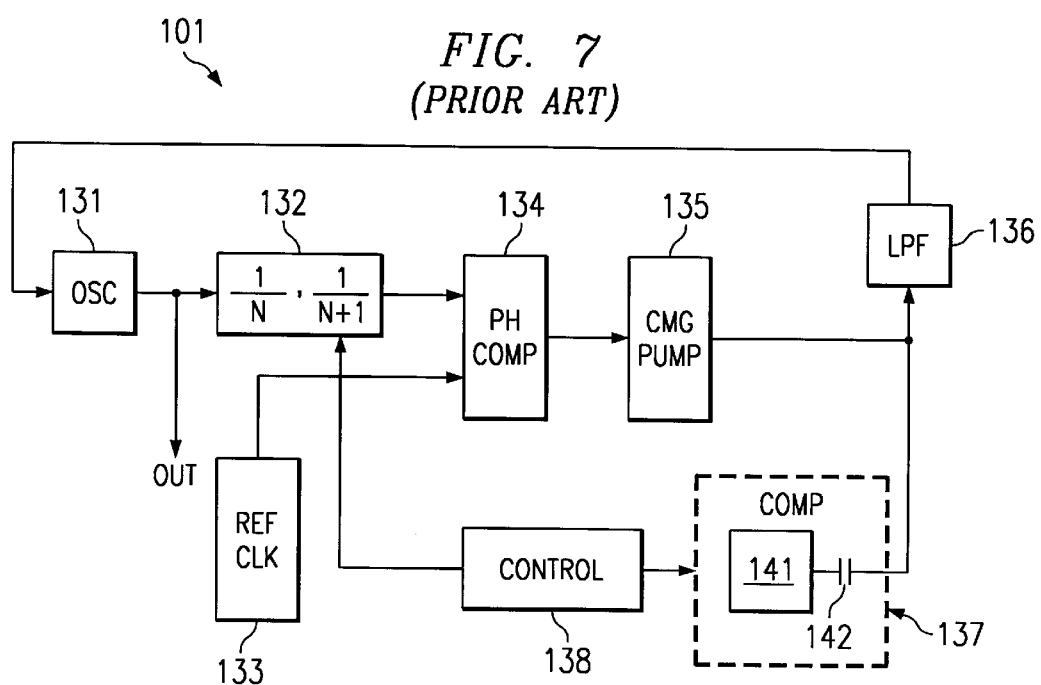

COMPENSATION CIRCUIT FOR FRACTIONAL-N FREQUENCY PLL SYNTHESIZER

FIELD OF INVENTION

The present invention pertains to a frequency synthesizer. In particular, the present invention pertains to a frequency synthesizer that can correctly compensate for ripple current.

BACKGROUND OF THE INVENTION

Frequency-division multiple channel access systems are used in cellular telephones. In order to shift the transmission frequency to an empty channel, a frequency synthesizer capable of high-speed locking is required.

Reference numeral (101) in FIG. 7 represents a conventional frequency synthesizer. A PLL (phase-locked loop) circuit of the fractional frequency-division type is used.

Said frequency synthesizer (101) is arranged in a semiconductor integrated circuit device which constitutes the sending/receiving circuit of a cellular phone. The frequency synthesizer comprises oscillator (131), frequency divider (132), reference clock signal generator (133), phase comparator (134), charge pump circuit (135), low-pass filter (136), compensation circuit (137), and control circuit (138). Oscillator (131) outputs an external output signal OUT. The external output signal OUT is input to frequency divider (132) and other circuits in the semiconductor integrated circuit device where said frequency synthesizer (101) is arranged.

Frequency divider (132) divides the frequency at the input external output signal OUT, generates a comparison signal; and then outputs the comparison signal. Said phase comparator (134) compares the phase of the comparison signal input from frequency divider (132) with the phase of the reference lock signal input from reference clock signal generator (133), controls charge pump circuit (135), and generates a control signal. The control signal is output to oscillator (131) via low-pass filter (136).

Oscillator (131) operates in such a way that the frequency of the external output signal OUT is varied according to the input control signal to make the phase of the comparison signal consistent with the phase of the reference clock signal. As a result, the frequency of the external output signal OUT becomes higher than the frequency of the reference clock signal by a multiple of the frequency division value of frequency divider (132).

Said frequency divider (132) is controlled by control circuit (138) so that its frequency division value varies periodically. For example, if the frequency of the reference clock signal is 200 kHz and the frequency division value is 5000 for seven clock cycles (35 μsec) and 5001 for one clock cycle (5 μsec), the average frequency division value obtained by averaging over eight clock cycles will be 5000.125 (=5000+⅛). The frequency of the external output signal OUT becomes 1000025 kHz, which is higher than the frequency of the reference clock signal by a multiple of the average frequency division value.

If the frequency division value is 4000 for six of eight cycles and is 4001 for the other two, the average frequency division value will be 4000.25, and the frequency of the external output signal OUT will be 800.050 MHz.

If the average frequency division value has a fractional part, it becomes possible to use a high frequency, such as 800 MHz or 1 GHz, in a narrow channel interval, such as 25 kHz or 12.5 kHz.

However, if the frequency division value is varied periodically as described above, even if after the external output signal OUT is locked to a desired frequency, a phase difference will occur due to inconsistency between the phase between the comparison signal and the reference clock signal. As a result, ripple current appears in the control signal output from charge pump circuit (135).

Reference symbol a in FIG. 8 indicates the waveform of the comparison signal output from frequency divider (132) after the external output signal OUT is locked when the frequency division value is varied by N and N+1. Reference symbol b indicates the waveform of the reference clock signal. Reference symbol c indicates the waveform of the ripple current included in the control signal output from charge pump circuit (135) as a result of inconsistency between the phase of the comparison signal relative to the reference clock signal.

The ripple current included in the control circuit [sic; signal] will cause a spurious component to appear in the external output signal OUT. Therefore, the ripple current not only impairs the receiving performance of the cellular phone or another telecommunication device but also acts as a source of interference during communication. This is a very serious problem.

A compensation circuit (137) having D/A converter (141) and capacitor (142) is arranged in said frequency synthesizer (101). D/A converter (141) varies the voltage applied to capacitor (142) to generate a compensation current of opposite polarity and the same amount of charge as the ripple current. The compensation current is superimposed on the control signal output from charge pump circuit (135) to cancel the ripple current. As a result, an external output signal OUT without the spurious component is obtained.

The amount of charge in the ripple current varies with time in such a way that it is an integer multiple of a certain amount of unit charge. The amount of unit charge is the product of the phase difference between the comparison signal and reference clock signal and the output current of the charge pump circuit. In the example described above, the frequency of the external output signal OUT was 1000025 kHz; if the output current of charge pump circuit (135) is a constant current of +1 mA or −1 mA, the following $Q_r$ $$Q_r = (\tfrac{1}{8}) \times (1/1000025 \text{ kHz}) \times 1 \text{ mA} \times \tfrac{1}{2} = 62.5 \times 10^{-15} \text{ (Coulomb)} \quad (101)$$

becomes the amount of unit charge.

The aforementioned compensation current with a charge amount in the range of ±1 time to a maximum of ±7 times (±$Q_r$) the amount of unit charge $Q_r$ is generated with the same period as the reference clock signal in the sequence of $$+7Q_r \rightarrow +5Q_r \rightarrow +3Q_r \rightarrow +1Q_r \rightarrow -1Q_r \rightarrow -3Q_r \rightarrow -5Q_r \rightarrow -7Q_r$$

In order to compensate for the ripple current, with the capacitance of capacitor (142) taken as $C_t$, if voltage $V_e$ which satisfies the following equation $$C_t \cdot V_e = Q_r \quad (102)$$

is used as the unit and the output voltage is varied as $-7V_e$, $-5V_e$, $-3V_e$, $-1V_e$, $+1V_e$, $+3V_e$, $+5V_e$, and $+7V_e$ by D/A converter (141), a compensation current with the opposite polarity and the same amount of charge as the ripple current can be generated.

However, as can be seen from said equation (101), the amount of the ripple current is proportional to the output current of charge pump circuit (135). Since the output current varies as a function of temperature, etc., the-ripple current cannot be compensated.

SUMMARY OF THE INVENTION

The general object of the present invention is to solve the aforementioned problems of the conventional technology by providing a technology which can correctly compensate for the ripple current.

This and other objects and features are provided by one aspect of the present invention by a frequency synthesizer comprising an oscillator that controls the frequency of an oscillation signal with an appropriate control signal, a frequency divider of the fractional frequency division type that frequency-divides the aforementioned oscillation signal and generates a comparison signal, a reference clock signal generator that generates a reference clock signal, a phase comparator that compares the phase of the aforementioned comparison signal with the phase of the aforementioned reference clock signal and outputs a phase difference signal, a charge pump circuit that outputs a current corresponding to the aforementioned phase difference signal, a low-pass filter that removes the high-frequency component of the current output from the aforementioned charge pump circuit and supplies its output as the conventional control signal to the aforementioned oscillator, and a compensation circuit that supplies a compensation current used for compensating the ripple current included in the aforementioned control signal to the output terminal of the aforementioned charge pump circuit; wherein the aforementioned frequency divider includes a prescaler which performs frequency dividing for the aforementioned oscillation signal and a counter that is operated corresponding to the output signal of the aforementioned prescaler to output the aforementioned comparison signal; and the aforementioned compensation current is determined on the basis of one of the frequency division values of the aforementioned prescaler which varies periodically, one period of the aforementioned frequency division value which varies periodically, and the time period of the aforementioned frequency division value.

Another aspect of the invention includes a frequency synthesizer having a correction circuit that includes a detection capacitor connected to the aforementioned charge pump circuit and is able to generate a reference voltage from the voltage of the aforementioned detection capacitor. The aforementioned compensation circuit includes a voltage generator that outputs a voltage corresponding to the aforementioned reference voltage, and a compensation capacitor connected between the aforementioned voltage generator and the output terminal of the aforementioned charge pump circuit. The capacitance ratio of the aforementioned detection capacitor to the compensation capacitor is determined on the basis of one of the frequency division values of the aforementioned prescaler that varies periodically, one period of the aforementioned frequency division value that varies periodically, and the time period of the aforementioned frequency division value. The aforementioned correction circuit charges/discharges the aforementioned detection capacitor with the output current of the aforementioned charge pump circuit only during the time period of one of the frequency division values of the aforementioned prescaler, and the aforementioned reference voltage is generated from the voltage of the aforementioned detection capacitor obtained by means of said charging/discharging.

A further aspect of the invention is provided by a the frequency synthesizer in which the time difference between charging and discharging of the aforementioned detection capacitor is set as the time for one period of the aforementioned oscillation signal whose frequency has been divided with one of the aforementioned frequency division values. The aforementioned detection capacitor is charged or discharged twice, and the aforementioned reference voltage is generated from the voltage of the detection capacitor obtained in that way.

Yet another aspect of the invention includes a voltage generator of the frequency synthesizer which outputs a voltage that is an integer multiple of the aforementioned reference voltage to the aforementioned compensation capacitor.

As described above, according to one aspect of the present invention, the frequency of the oscillation signal output from the oscillator is divided while the frequency division value is varied periodically by the prescaler in the frequency divider, and the counter operates correspondingly to generate a comparison signal. The comparison signal and the reference clock signal are input to the phase comparator.

The charge pump circuit of one aspect of the invention is operated by the phase comparator which compares the phase of the comparison signal relative to the input reference clock signal. A constant current is output from the charge pump circuit corresponding to the phase difference. After the high-frequency component is removed from the current with the low-pass filter, a control signal is obtained.

The control signal output from the low-pass filter of one aspect of the invention is input to the oscillator. The oscillator varies the frequency of the oscillation signal on the basis of the control signal. As a result, the frequency of the oscillation signal becomes higher than the frequency of the reference clock signal by a multiple of the average frequency division value. In this way, the frequency of the oscillation signal is increased, and the channel interval is reduced.

A compensation circuit of one aspect of the invention is arranged in the frequency synthesizer to generate a compensation current opposite in sign to the ripple current that appears in the control signal. Since the compensation current is superimposed on the control signal, the ripple current that appears in the control signal is cancelled out, and the spurious oscillation signal component is eliminated.

However, if the amount of charge in the ripple current varies and becomes inconsistent with the compensation current, the ripple current cannot be cancelled out correctly.

Therefore, a frequency synthesizer which makes the amount of the compensation current follow the variation in the amount of the output current of the charge pump circuit is proposed as one aspect of the present invention. Since the amount of charge in the ripple current is proportional to the amount of the output current of the charge pump circuit, once the reference charge amount becomes consistent with the amount of charge in the ripple current, the compensation current can follow the variation in the ripple current, if any exists. Consequently, the amount of charge in the compensation current can be kept equal to the amount of charge in the ripple current correctly and with only the opposite polarity.

The compensation circuit of the frequency synthesizer of one aspect of the invention has a compensation capacitor and a voltage generator. One end of the compensation capacitor is connected to the output end of the charge pump circuit, and the other end is connected to the voltage generator. The voltage applied to the compensation capacitor is varied on the basis of the reference voltage input to the voltage generator to generate a compensation current. The reference voltage is supplied from a correction circuit. The correction circuit has a detection capacitor which is charged/discharged by the charge pump circuit. The voltage of the detection capacitor is output as the reference voltage. In this way, the amount of compensation current can follow the amount of output current of the charge pump circuit. As a result, the amount of charge in the compensation current can be made to follow the amount of charge in the ripple current.

However, the unit amount of charge in the ripple current is expressed as the product of the phase difference between the comparison signal and the reference clock signal and the output current of the charge pump circuit. The amount of charge in the ripple current varies as an integer multiple of the amount of unit charge for the same period as the reference clock signal.

As a result, if the charge/discharge time of the detection capacitor is set regardless of the oscillation signal, which is related to the unit charge in the ripple current, when the period of the oscillation signal varies, then the charge/discharge time does not change following the variation in the oscillation signal, nor does the charge on the detection capacitor change as a result of charging/discharging.

Consequently, the amount of the compensation determined by the charge on the detection capacitor as a result of charging/discharging cannot follow the amount of the output current after the oscillation signal is varied. As a result, the amount of charge in the compensation current cannot follow the amount of charge in the ripple current to cancel the ripple current.

In one aspect of the present invention, however, if the reference voltage is determined, the capacitance ratio between the detection capacitor and the compensation capacitor is determined on the basis of one of the frequency division values of the aforementioned prescaler which varies periodically, one period of the aforementioned frequency division value which varies periodically, and the time period of the aforementioned frequency division value. The detection capacitor which satisfies the capacitance ratio is charged/discharged by the output current of the charge pump circuit only during the time of one period of the prescaler, and the reference voltage is generated from the voltage appearing at the two ends of the detection capacitor during charging/discharging.

Therefore, when the period of the oscillation signal varies, the reference voltage also changes correspondingly.

In the compensation circuit of one aspect of the invention, a voltage generator outputs a voltage corresponding to the reference voltage to the compensation capacitor, and a compensation current is generated when the compensation capacitor is charged/discharged. Therefore, when the reference voltage changes, the amount of compensation current also changes. The compensation current can follow the variation in the amount of the output current of the charge pump circuit which causes the variation in the oscillation signal.

Consequently, even if the oscillation signal varies, the amount of charge in the compensation current can follow the amount of charge in the ripple current, and the ripple current can be cancelled out correctly.

Also, the charge/discharge time of the detection capacitor in one aspect of the invention is varied. The difference between various charge/discharge times is set to be equal to one period of the aforementioned oscillation signal whose frequency has been divided by one of the frequency division values. The detection capacitor is charged/discharged at least twice. The voltage across the detection capacitor during each charge/discharge cycle is stored, and the reference voltage is obtained from this voltage difference. In this way, the error in the voltage value caused by the difference in time, which is taken by the switch that controls charging/discharging to change from the conductive state to the cut-off state, and the time taken by the switch to change from the cut-off state to the conductive state can be eliminated from the reference voltage. Consequently, the amount of charge in the compensation current can be made equal (with opposite polarity) to the amount of charge in the ripple current.

BRIEF DESCRIPTION OF THE DRAWINGS

FIG. 6 is a partial block diagram illustrating a second example of the frequency synthesizer of the present invention.

FIG. 7 is a block diagram illustrating a conventional frequency synthesizer.

DETAILED DESCRIPTION

Figure 1:
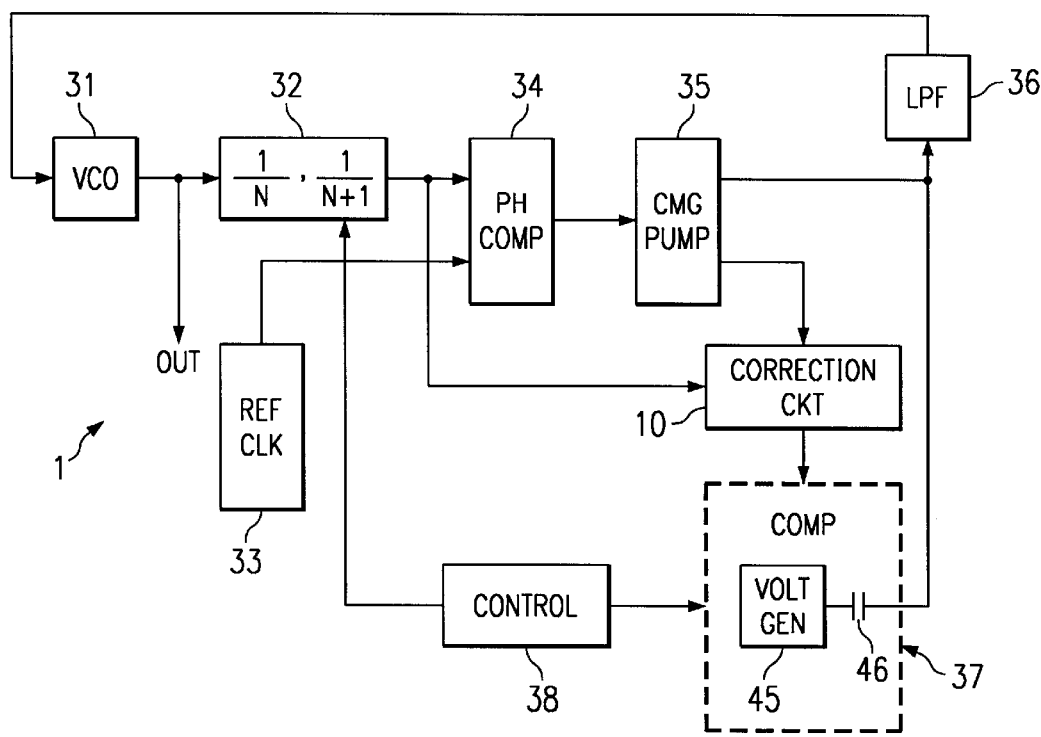
FIG. 1 is a block diagram illustrating the first example of the frequency synthesizer of the present invention.

As shown in FIG. 1, reference symbol (1) indicates the first example of the frequency synthesizer of the present invention. It is incorporated in a semiconductor integrated circuit device.

Said frequency synthesizer (1) comprises oscillator (31) (voltage control oscillator), frequency divider (32), reference clock signal generator (33), phase comparator (34), charge pump circuit (35), low-pass filter (36), control circuit (38), correction circuit (10), and compensation circuit (37). Oscillator (31), frequency divider (32), phase comparator (34), charge pump circuit (35), and low-pass filter (36) form a PLL loop. An external output signal OUT is output from oscillator (31) to frequency divider (32) and also supplied to the other circuits in the semiconductor integrated circuit device.

Frequency divider (32) is controlled by control circuit (38), and the frequency division value is varied periodically. The frequency of the external output signal OUT is divided by the frequency division value to generate a comparison signal.

Reference clock signal generator (33) generates a reference clock signal with a prescribed frequency. The reference clock signal and the aforementioned comparison signal are input to phase comparator (34).

Phase comparator (34) compares the phases of the two signals to get the phase difference. Charge pump circuit (35) is controlled on the basis of this phase difference. Charge pump circuit (35) performs current conversion for the input phase difference signal and sends the output as a control signal to oscillator (31) via low-pass filter (36).

According to the input control signal, oscillator (31) varies the frequency of the external output signal OUT appropriately to reduce the phase difference between the comparison signal and the reference clock signal. The PLL loop locks when the frequency of the external output signal OUT becomes a value that is a multiple of the average frequency division value of frequency divider (32).

If the frequency division value of frequency divider (32) is N for seven reference clock cycles and N+1 for one cycle and if a total of eight cycles (seven plus one cycle) is used to form the unit (the unit will be referred to as one period of fractional frequency division hereinafter), when the frequency division value is varied periodically, the average frequency division value becomes N+⅛. If the reference clock signal is 200 kHz and N is 5000, the frequency of the external output signal OUT is 1000025 kHz.

Figure 2:
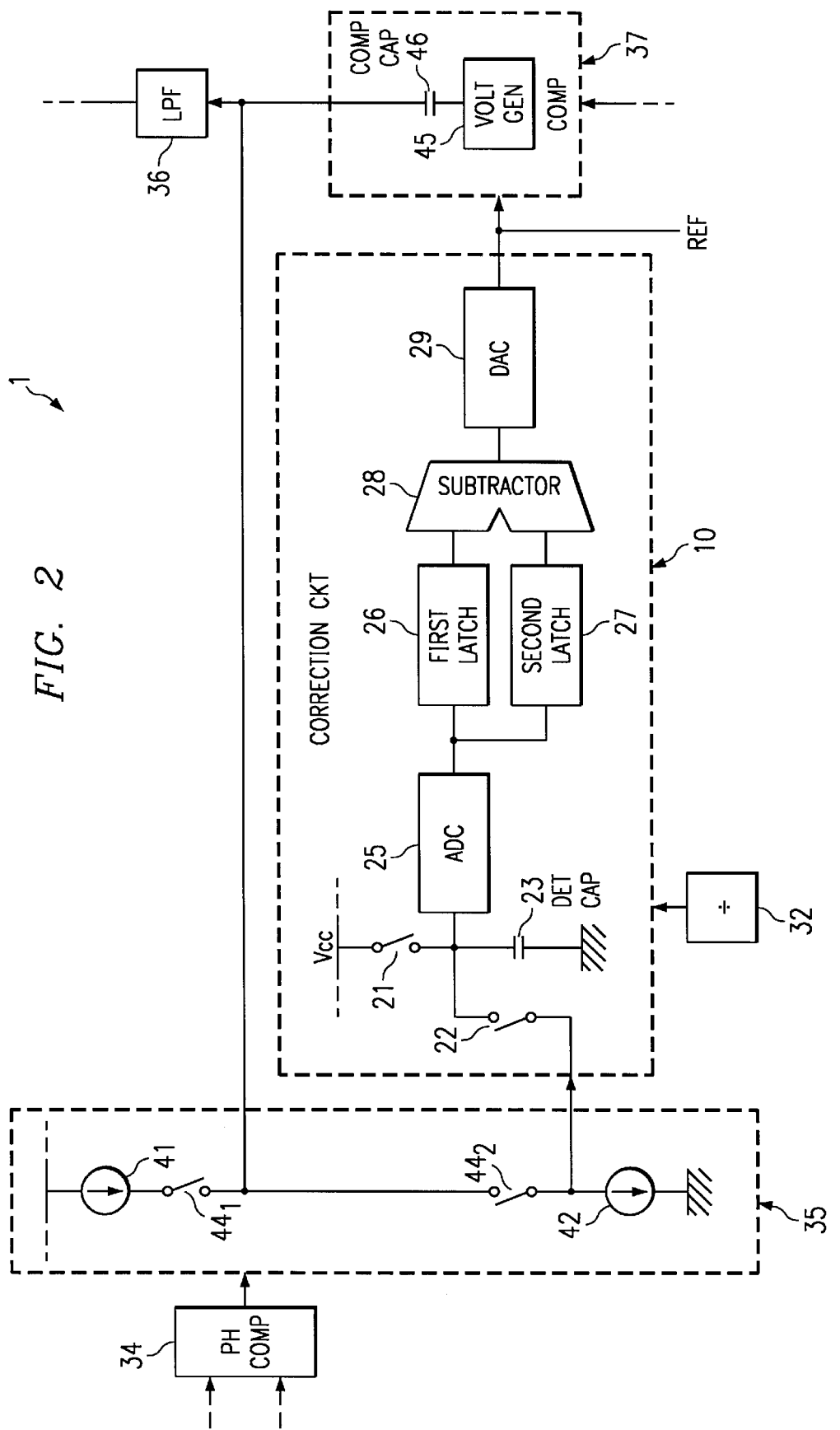
FIG. 2 is the internal block diagram of the charge pump circuit and the correction circuit of the aforementioned frequency synthesizer.

As shown in FIG. 2, the output stage of charge pump circuit (35) has constant current source (41), constant current sink (42), switch (44$_1$) on the source side, and switch (44$_2$) on the sink side. Said switches (44$_1$) and (44$_2$) are controlled by phase comparator (34). Either constant current source (41) or constant current sink (42) is connected to the output terminal only for a period of time corresponding to the phase difference between the reference clock signal and the comparison signal. As a result, constant current flows into/from charge pump circuit (35) only for a period of time corresponding to the phase difference.

The constant current flowing into/from charge pump circuit (35) becomes a control signal. The control signal is output to oscillator (31) via low-pass filter (36).

Depending on the input control signal, oscillator (31) varies the frequency of the external output signal OUT to make the phase of the comparison signal consistent with the phase of the reference clock signal.

As shown in FIG. 2, correction circuit (10) has a first switch (21), a second switch (22), and a detection capacitor (23). One end of detection capacitor (23) is connected to ground. The other end of detection capacitor (23) is connected to power supply $V_{cc}$ and constant current sink (42) via the first switch (21) and the second switch (22), respectively. When the first switch (21) is closed and the second switch (22) is open, the voltage $V_{23}$ at the other end of detection capacitor (23) is charged to the power supply voltage $V_{cc}$.

On the other hand, when the first switch (21) is open and the second switch (22) is closed, the voltage $V_{23}$ at the other end of detection capacitor (23) is discharged by a constant current, that is, the output current $I_{out}$ of constant current sink (42), and the voltage falls at a rate of $I_{out}/C_t$ per unit time.

A/D converter (25), a first latch (26) and a second latch (27), subtractor (28), and D/A converter (29) are arranged in correction circuit (10). The voltage on detection capacitor (23) is converted into a digital values by A/D converter (25). The obtained digital value is stored in the first latch (26) or the second latch (27).

The contents stored in the first latch (26) and the second latch (27) are processed by subtractor (28). The result of subtraction is output to D/A converter (29). The difference between the digital value stored in the first latch (26) and the second latch (27) is converted back to an analog value by D/A converter (29). The analog value is output as a reference voltage to compensation circuit (37).

A voltage generator (45) that generates a voltage for generating a compensation current and a compensation capacitor (46) for generating the compensation current are arranged in compensation circuit (37). When the reference voltage is input from correction circuit (10), voltage generator (45) generates a voltage on the basis of the reference voltage. The generated voltage is output to compensation capacitor (46). Compensation current is generated as a result of charging/discharging of compensation capacitor (46). The ripple current can be cancelled by superimposing the compensation current on the control signal.

Figure 5:
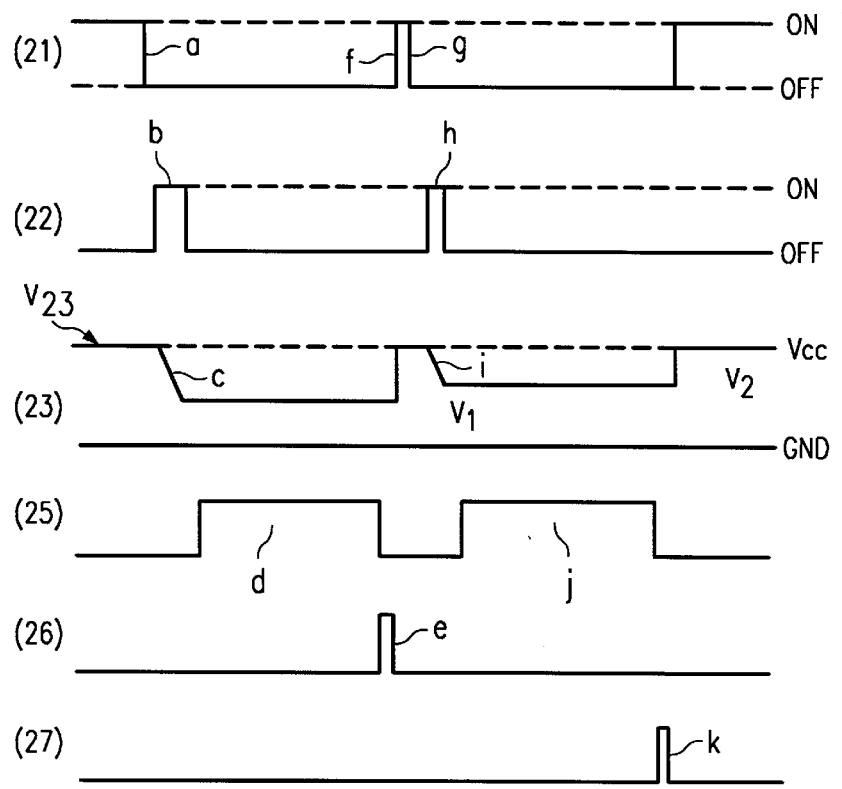
FIG. 5 is a timing diagram for explaining the operation of the correction circuit.
Figure 8:
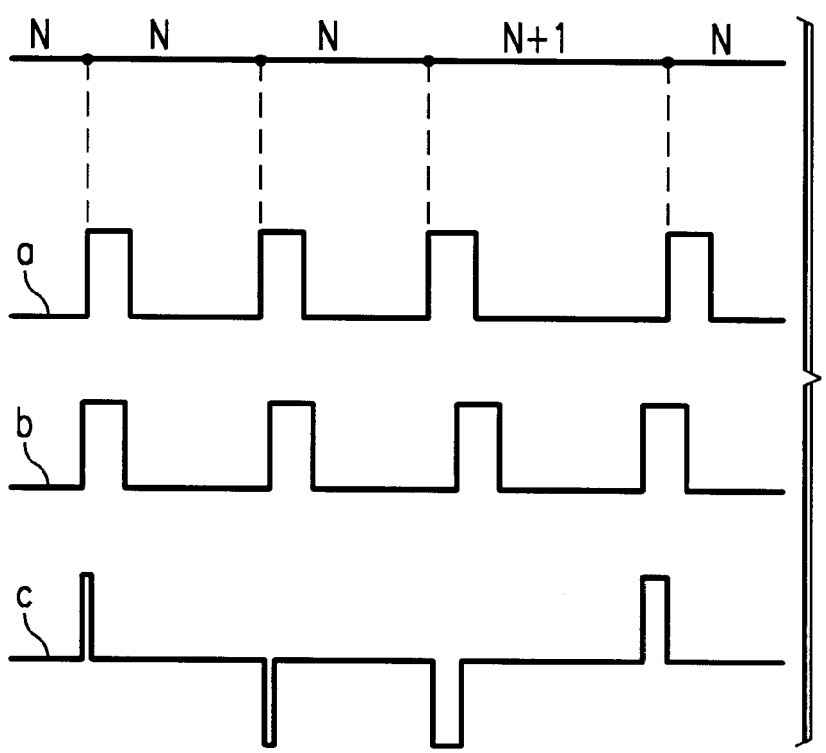
FIG. 8 is the timing diagram for explaining ripple current.
Explanation of reference symbols
1,2 Frequency synthesizer
10 Correction circuit
23 Detection capacitor
31 Oscillator
32 Frequency divider
34 Phase comparator
35 Charge pump circuit
37, 37 Compensation circuit
45, 51 Voltage generator
46, 53 Compensation capacitor

The sequence of operations performed by frequency synthesizer (1) with the aforementioned configuration to cancel out ripple current will be explained below with reference to the timing diagram shown in FIG. 5. First, the PLL loop of frequency synthesizer (1) is locked with compensation (37) or correction circuit (10) in an idle state to stabilize the frequency of external output signal OUT to a certain degree. Then, the first switch (21) is closed, and the second switch (22) is opened. The voltage $V_{23}$ on detection capacitor (23) is charged to the power supply voltage $V_{cc}$.

When the first switch (21) is then opened (reference symbol a in FIG. 5) and the second switch (22) is closed (reference symbol b), the other end of detection capacitor (23) is connected to constant current sink (42). The detection capacitor discharges with constant current, that is, the output current $I_{out}$ of constant current sink (42).

The output of frequency divider (32) is connected to correction circuit (10) to input the external output signal OUT whose frequency has been divided by said frequency divider (32). The period during which the second switch (22) is kept closed is controlled by control circuit (38) to be an integer multiple of the period of the external output signal OUT.

Figure 3:
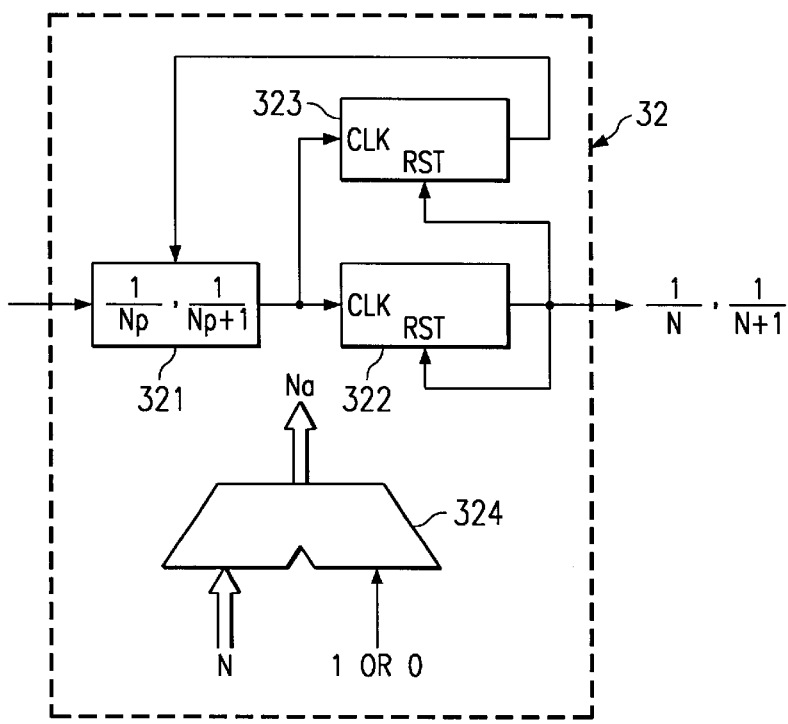
FIG. 3 is the internal block diagram of frequency divider (32).

In this case, the frequency of the external output signal OUT is divided by frequency divider (32) using two frequency division values, that is, N and N+1. As shown in FIG. 3, frequency divider (32) is comprised of prescaler (321) which is capable of fixed frequency division by $1/N_p$ and $1/(N_p+1)$, main counter (322) and sub-counter (323), which operate corresponding to the output signal of prescaler (321), and adder (adder) (324). The frequency division value Na of said frequency divider (32) is defined as Na=$N_p$×Nmain+Nsub. If $N_p=2^x$, $0<Nsub<2^x$, $2^x<Nmain<2^y$ (y>x). For example, if sub-counter (323) is a 5-bit counter and main counter (322) is a 11-bit counter, $N_p=32$, $N_p+1=33$, $2^x=2^5$, and $2^y=2^{11}$. Nsub is set by sub-counter (323), while Nmain is set by main counter (322). In the following, the case of charging/discharging detection capacitor (23) using the period of a signal obtained by frequency dividing the external output signal OUT by $1/N_p$ with prescaler (321) will be explained.

If the frequency of the external output signal OUT divided by prescaler (321) is taken as $f_{vco}/N_p$ and the capacitance of detection capacitor (23) is $C_t$, and if the closed state is held for two periods $\{2\times(N_p/f_{vco})\}$, the voltage $V_{23}$ on detection capacitor (23) is the following.

$$V_{23}=V_{cc}[I_{out}\times\{2\times(N_p/f_{vco})\}/C_t+V_{err}] \quad (1).$$

Said $V_{err}$ is the error voltage caused by various reasons, such as the difference between the time taken by the second switch (22) to change from the closed state to the open state and the time taken to change from the open state to the closed state.

When the second switch (22) is opened after the time $2\times(N_{p/fvco})$ has passed, the operation of A/D converter (25) is started to convert the voltage $V_{23}$ of detection capacitor (23) to a digital value (reference symbol d). The digital value is stored in the first latch (26) (reference symbol e).

When the first switch (21) is closed again (reference symbol f) after the second switch (22) is opened, detection capacitor (23) is charged, and its voltage $V_{23}$ becomes the power supply voltage $V_{cc}$.

Then, when the first switch (21) is opened and the second switch (22) is closed (reference symbols g and h), detection capacitor (23) is connected to constant current sink (42). The discharge of detection capacitor (23) at a constant current rate is started (reference symbol i).

At this time, if the second switch (22) is kept closed for one period of the external output signal OUT whose frequency has been divided by prescaler (321), the voltage $V_{23}$ on detection capacitor (23) becomes $$V_{23}=V_{cc}[I_{out}\cdot\{1\times(N_p/f_{vco})\}/C_t+V_{err}] \quad (2)$$

Although the frequency of the external output signal OUT is divided by two frequency division values $N_p$ and $N_p+1$, using prescaler (32), only frequency division with the frequency division value $N_p$ will be explained below.

After the second switch (22) is opened after a period of time of $1\times(N_p/f_{vco})$, the operation of A/D converter (25) is started to convert the voltage $V_{23}$ on detection capacitor (23) to a digital value (reference symbol j). The digital value is stored in the second latch (27) (reference symbol k).

After the digital values are stored in the first and second latches (26) and (27), the difference between the digital values stored in the first and second latches (26) and (27) is calculated by subtractor (28). If the voltage values stored in the first latch (26) and the second latch (27) are $V_1$ and $V_2$, respectively, the difference voltage $V_d$ will be:

$$V_d=V_1-V_2=I_{out}\cdot\{1\times(Np_p/f_{vco})\}/C_t \quad (3).$$

The error voltage $V_{err}$ is cancelled out.

Consequently, the digital value which represents voltage $V_d$ output from subtractor (28) does not include error voltage $V_{err}$. The digital value is converted to an actual voltage by D/A converter (29). The actual voltage is output as reference voltage $V_d$ to compensation circuit (37).

When the frequency of the external output signal OUT is divided by frequency divider (32) using the frequency division values N and N+1 during the periods $T_1$ and $T_2$ of the reference clock signal, the average frequency division value is $N+\{T_2/(T_1+T_2)\}$. If the frequency of the external output signal OUT is $f_{vco}$, the amount of charge in the ripple current becomes an integer multiple of the amount of unit charge $Q_r$ which is expressed as follows.

$$Q_r=\{1/(T_1+T_2)\}\cdot(1/f_{vco})\cdot I_{out}\cdot(½) \quad (4).$$

In equation (4), $(T_1+T_2)$ is equivalent to one period of fraction frequency division.

If the capacitance of compensation capacitor (46) in compensation circuit (37) is taken as $C_o$ and the voltage variation of voltage generator (45) is $V_{AD}$, the amount of charge in the compensation current is $C_o\cdot V_{AD}$. If the voltage variation $V_{AD}$ of A/D converter (45) is an integer multiple of the input reference voltage $V_d$, the minimum value of the voltage variation $V_{AD}$ is equal to the reference voltage $V_d$. In this case, the amount of charge $Q_o$ in the compensation current becomes $$Q_o=C_o\cdot V_d \quad (5).$$

Said amount of charge $Q_o$ is the unit amount of charge in the compensation current. To correctly cancel the ripple current, the amount of unit charge $Q_o$ must be equal to the amount of unit charge $Q_r$ in the ripple current. Consequently, the following equation must be satisfied.

$$Q_o=Q_r \quad (6)$$

If the output current from constant current source (41) is made to be equal to the output current $I_{out}$ of constant current sink (42) and said equations (3)–(6) are solved as simultaneous equations, $Q_o$, $Q_r$, $I_{out}$, $V_d$, and $f_{vco}$ cancel out, and the following condition equation is obtained.

$$C_o/C_t=1/\{2(T_1+T_2)\times N_p\} \quad (7)$$

The capacitance values of compensation capacitor (46) and detection capacitor (23) are set appropriately to satisfy said condition equation (7), that is, to make the ratio $C_o/C_t$ of capacitance $C_o$ to $C_t$ on the left side equal the value on the right side.

If the capacitance ratio $C_o/C_t$ between compensation capacitor (46) and detection capacitor (23) satisfies equation (7), the amount of unit charge $Q_o$ in the compensation current can be made to be equal to the amount of unit charge $Q_r$ in the ripple current. Also, since there is no output current $I_{out}$ on the right side of equation (7), when $C_o/C_t$ satisfies equation (7), even when the amount of the output current $I_{out}$ varies, the amount of the compensation current can follow such variations so that the ripple current can be cancelled out correctly.

If compensation capacitor (46) and detection capacitor (23) are formed in a semiconductor integrated circuit device, it is difficult to set the capacitances $C_o$ and $C_t$ as designed. However, if compensation capacitor (46) and detection capacitor (23) are made of the same material and have the same configuration, it is a simple matter to keep the capacitance ratio $C_o/C_t$ constant.

Even if the capacitance values of $C_o$ and $C_t$ vary under the influence of temperature, etc., as long as compensation capacitor (46) and detection capacitor (23) are made from the same material, have the same configuration, and are formed in the same semiconductor integrated circuit device, the percentages of the capacitance variations are also the same, and the capacitance ratio, $C_o/C_t$ will not change. Therefore, said equation (7) can still be satisfied.

In said equation (7), when $T_1=7$, $T_2=1$, $N_p=32$, and the average frequency division value is $32+\frac{1}{8}$, equation (7) becomes $$C_o/C_t=1/\{2\times(7+1)\times32\}=1/512. \quad (8)$$

The capacitance $C_t$ of compensation capacitor (46) is 512 times larger than the capacitance $C_o$ of detection capacitor (23). If the capacitance $C_o$ of detection capacitor (23) is 0.1 pF, the capacitance $C_t$ of compensation capacitor (46) will be 51.2 pF.

Consequently, if compensation capacitor (46) and detection capacitor (23) are made up 0.1-pF capacitors from the same material and with the same configuration, then 512 capacitors will be required for compensation capacitor (46) and one for detection capacitor (23).

In this case, if the output current $I_{out}$ of charge pump circuit (35) is 1 mA and the frequency of the external output signal OUT is 1 GHz, according to said equation (3), the reference voltage $V_d$ becomes the following.

$$V_d=1(mA)\cdot\{1\times32/1(GHz)\}/51.2(pF)=0.625(V)$$

Figure 4:
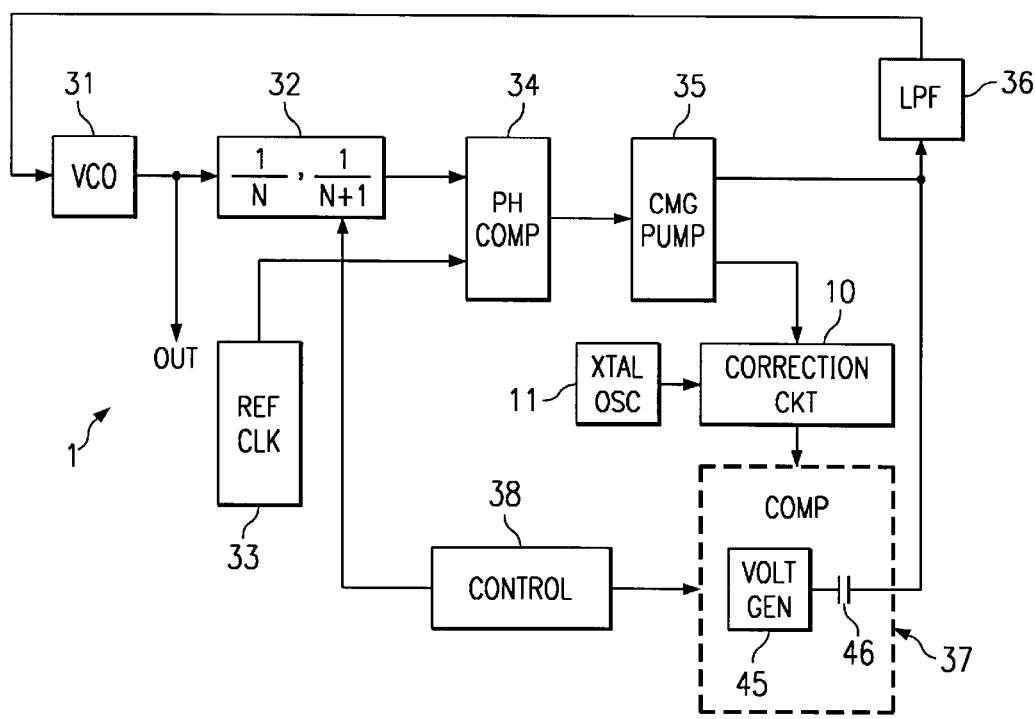
FIG. 4 is a block diagram illustrating the configuration of another frequency synthesizer related to the present invention.

The circuit shown in FIG. 4 has been designed by the present inventors with the same purpose as that of the present invention to correctly compensate for ripple current. FIG. 4 has the same configuration as FIG. 1 except that a crystal oscillator (11) has been added to the circuit shown in FIG. 1. Therefore, the parts are represented by the same reference symbols used in FIG. 1, and the explanation for these parts is omitted.

As shown in FIG. 4, crystal oscillator (11) is arranged in circuit (1). The charge/discharge time of detection capacitor (23) is determined on the basis of the clock signal with a frequency of about 10 MHz output from crystal oscillator (11).

If the frequency of the clock signal of crystal oscillator (11) is $f_r$, it will take detection capacitor (23) time $2/f_r$ of two clock cycles of crystal oscillator (11) to discharge from the power supply voltage $V_{cc}$ at a constant current. After the voltage $V_1$ is measured across the two ends of detection capacitor (23), the voltage across the two ends of detection capacitor (23) returns to $V_{cc}$. Then, the voltage is discharged by a constant current only for the time $1/f_r$ of one clock cycle of crystal oscillator (11), followed by measuring the voltage $V_2$ across the two ends of detection capacitor (23). The voltage difference $V_d$ is derived as follows:

$$V_d = V_1 - V_2 = I_{out} \cdot (1/f_r)/C_t \tag{3}$$

If the average frequency division value of frequency divider (32) becomes N+⅛ and the frequency of the external output signal OUT is $f_{vco}$, the amount of charge in the ripple current becomes an integer multiple of the following amount of unit charge $Q_r$.

$$Q_r = (1/8) \cdot (1/f_{vco}) \cdot I_{out}(1/2) \tag{4'}$$

If the capacitance of compensation capacitor (46) in compensation circuit (37) is $C_o$ and the voltage variation amount of voltage generator (45) is $V_{AD}$, the amount of charge-in the compensation current become $C_o \cdot V_{AD}$. If the amount of voltage variation $V_{AD}$ of A/D converter (45) becomes an integer multiple of the input reference voltage $V_d$, the minimum value of the voltage variation amount $V_{AD}$ is equal to the reference voltage $V_d$. In this case, the amount of change in the compensation current $Q_0$ becomes the following:

$$Q_o = C_o \cdot V_d \tag{5'}$$

Said amount of charge $Q_o$ is the unit amount of charge in the compensation current. To correctly cancel ripple, the amount of unit charge $Q_o$ must be equal to the amount of unit charge $Q_r$ in the ripple current. Consequently, the following equation must be satisfied.

$$Q_0 = Q_r \tag{6'}$$

When said equations (3)'-(6)' are solved as a set of simultaneous equations, $Q_o$, $Q_r$, $I_{out}$, and $V_d$ cancel out, yielding the following relation.

$$C_o/C_t = (f_r/f_{vco}) \cdot (1/6) \tag{7'}$$

In the circuit shown in FIG. 4, if the capacitance values of compensation capacitor (46) and detection capacitor (23) are determined appropriately to satisfy equation (7)', an appropriate compensation current $C_o$ can be output to compensate the ripple current $C_r$ without being affected by the output current $I_{out}$.

Also, a lock signal output from crystal oscillator (11) is used to determine the charge/discharge time of detection capacitor (23). Since this clock signal always has a constant period $1/f_r$, the ripple current can be compensated even before the PLL loop locks and the output frequency $f_{vco}$ of oscillator (31) has not been fixed.

However, since there is the term $f/f_{vco}$ on the right side of said equation (7'), when $f_r/f_{vco}$ varies, to satisfy equation (7)', the capacitance ratio between compensation capacitor (46) and detection capacitor (23) must be varied.

As a result, even if the clock signal of crystal oscillator (11) is subjected to temperature compensation so that $f_r$ is a constant value, in the case when oscillator (31) can output external output signal OUT at several frequencies, when an external output signal OUT at a different frequency $f_{vco}'$ is output after an external output signal OUT at a frequency $f_{vco}$ that satisfies equation (7)' is output, equation (7)' cannot be satisfied if $(C_o/C_t)$ is not varied corresponding to the change of the frequency $f_{vco}'$. Consequently, since external output signals OUT with different frequencies are output, if $(C_o/C_t)$ is not adjusted, the ripple current cannot be correctly cancelled out.

In the present invention, however, since the terms for output current $I_{out}$ and the output frequency $f_{vco}$ of oscillator (31) do not appear on the right side of equation (7) and the frequency division value is constant, $C_o/C_t$ will be constant. Consequently, even if oscillator (31) outputs a different frequency after equation (7) has been satisfied, the ripple current can be correctly cancelled without deviating from equation (7). There is no need to readjust the capacitance ratio $C_o/C_t$ of compensation capacitor (46) and detection capacitor (23) according to the frequency of external output signal OUT.

In the case of the circuit shown in FIG. 4 and using crystal oscillator (11), if the frequency of crystal oscillator (11) is about 10 MHz, its period is about 100 nsec, and detection capacitor (23) is charged with said period of about 100 nsec as unit time. In the present invention, however, the frequency of the external output signal OUT is about 1 GHz. If the frequency division ratio is 32 or 16, the period of the output signal of frequency divider (33) is 32 nsec or 16 nsec. Consequently, compared with the circuit shown in FIG. 4, detection capacitor (23) can be charged/discharged in a short period of time.

Consequently, the capacitance $C_t$ of detection capacitor (23) can be reduced as a result of the short charge/discharge time. In particular, if frequency synthesizer (1) of the present invention is formed in a semiconductor integrated circuit, the circuit scale can be reduced.

The case in which compensation circuit (37) applies a voltage to one capacitor (compensation capacitor (46)) has been explained above. The present invention, however, is not limited to frequency synthesizer (1) equipped with said compensation circuit (37).

For example, frequency synthesizer (2) (the second example of the present invention) using compensation circuit (37') instead of said compensation circuit (37) is also included in the present invention.

Said frequency synthesizer (2) has the same configuration as frequency synthesizer (1) in the first example except for compensation circuit (37'). The explanation of the overall operation is omitted.

Said compensation circuit (37') has multiple detection capacitors (53), multiple switches (54), and voltage generator (51). Voltage generator (51) has two power supplies ($51_1$) and ($51_2$). One end of each capacitor (53) is connected to two power supplies ($51_1$) and ($51_2$) via respective switch (54). The other end is connected to the output terminal of charge pump circuit (35).

The reference voltage $V_d$ input from correction circuit (10) is input to voltage generator (51). In said voltage generator (51), there is a difference equal to the magnitude of reference voltage $V_d$ in the output voltage between two power supplies (51$_1$) and (51$_2$).

Switches (54) connect each of capacitors (53) to either power supply (51$_1$) or power supply (51$_2$). If the capacitance of capacitor (53) is $C_o$, a compensation current with a amount of charge of $\pm C_o \cdot V_d$ (=$Q_r$) can be generated by switching the connection of one capacitor (53) from one of power supplies (51$_1$) or (51$_2$) to the other. Consequently, when the connection of M capacitors (53) is switched, a compensation current with an amount of charge of $\pm M \cdot Q_r$ can be generated.

Said compensation circuit (37') and correction circuit (10) are not affected by the variation in the output current $I_{out}$ of charge pump circuit (35) or the variations in capacitances $C_o$ and $C_r$, and the ripple current can be correctly cancelled.

In the aforementioned embodiment, the frequency of an external output signal OUT is divided with the frequency division value of pre-scaler (321) in frequency divider (32) varied as two values $N_p$ and $N_p+1$ within one period of fractional frequency division. The present invention, however, is not limited to this case. The frequency of an external output signal OUT can also be divided with the frequency division value of frequency divider (32) varied as three, four, or even more values within one period of fractional frequency dividing.

What is claimed is:

1. A frequency synthesizer comprising: an oscillator that controls a frequency of an oscillation signal with an appropriate control signal,
   a frequency divider of a fractional frequency division type that frequency-divides the oscillation signal and generates a comparison signal,
   a reference clock signal generator that generates a reference clock signal,
   a phase comparator that compares the phase of the comparison signal with the phase of the reference clock signal and outputs a phase difference signal,
   a charge pump circuit that outputs current corresponding to the phase difference signal,
   a low-pass filter that removes a high-frequency component of the current output from the charge pump circuit and supplies its output as the conventional control signal to the oscillator, and
   a compensation circuit that supplies a compensation current used for compensating a ripple current included in the control signal to the output terminal of the charge pump circuit; wherein
      the frequency divider includes a prescaler that frequency divides the oscillation signal and a counter that is operated corresponding to the output signal of the prescaler to output the comparison signal; and
      a correction circuit that includes a detection capacitor connected to the charge pump circuit and is able to generate a reference voltage from the voltage of the detection capacitor;
      the compensation circuit including a voltage generator that outputs a voltage corresponding to the reference voltage, and a compensation capacitor connected between the voltage generator and the output terminal of the charge pump circuit;
      the capacitance ratio of the detection capacitor to the compensation capacitor is determined on the basis of one of the frequency division values of the prescaler that varies periodically, one period of the frequency division value which varies periodically, and the time period of the frequency division value;
      the correction circuit charges/discharges the detection capacitor with the output current of the charge pump circuit only during the time period of one of the frequency division values of the prescaler, and the reference voltage is generated from the voltage of the detection capacitor obtained by means of the charging/discharging.

2. The frequency synthesizer described in claim 1 wherein the time difference between charging and discharging of the detection capacitor is set as the time for one period of the oscillation signal whose frequency has been divided with one of the frequency division values; the detection capacitor is charged or discharged twice, and the reference voltage is generated from the voltage of the detection capacitor obtained in that way.

3. The frequency synthesizer described in claim 2 wherein the voltage generator outputs a voltage that is an integer multiple of the reference voltage, to the compensation capacitor.

4. The frequency synthesizer described in claim 1 wherein the voltage generator outputs a voltage that is an integer multiple of the reference voltage, to the compensation capacitor.

5. A phase locked loop frequency synthesizer circuit comprising:
   a voltage controlled variable frequency oscillator (VCO) circuit generating a VCO output signal,
   a variable N divider circuit that divides the VCO output signals generating a divided output signal, the divider including a prescaler that divides the VCO output signal and counters driven by the prescaler output and drive the phase comparator input;
   a reference clock signal generator circuit;
   a phase comparator circuit that compares divider output signal and reference clock signal, and outputs a phase difference time signal;
   a charge pump circuit that outputs current pulse having a pulse width corresponding to phase difference time signal;
   a spurious compensation circuit that cancels a charge pump output current ripple component caused by varying-N dividing in the divider circuit;
   a low pass filter circuit that reduces ripple of the sum of output current from the charge pump circuit and output charge from the spurious compensation circuit; and
   a compensation voltage generation circuit that generates a voltage to the spurious compensation circuit, the voltage being based on an output of a prescaler output clock cycle time or reference output clock cycle time and the output current of the charge pump circuit.

6. A phase locked loop frequency synthesizer circuit of claim 5, wherein the spurious compensation circuit further comprises a capacitor;
   a digital to analog converter (DAC);
   the DAC driving one node of the capacitor, another node of the capacitor being connected to the charge pump output;
   wherein a charging input value of the DAC generates a charge on the capacitor according to the formula:

$C*(\text{delta-}V)$ wherein C is capacitance value and
   (delta-V) is output voltage change of DAC.

7. A phase locked loop frequency synthesizer circuit of claim 6, wherein the compensation voltage generation circuit further comprises, a variable reference capacitor composed of MOS analog switches and capacitors that have same temperature and variation characteristics with the capacitor;

an analog switch to precharge to the variable reference capacitor;

an analog switch coupled between the variable reference capacitor and the charge pump circuit node wherein the compensation voltage is generated by integrating the charge pump output current through the analog switch and the variable capacitor for a cycle time of the prescaler output clock or reference clock, the ratio of the variable capacitor value in the compensation voltage generation circuit to the capacitor value in the spurious compensation circuit being determined by the divider number value in prescaler or the frequency ratio of the VCO output frequency to the reference clock signal frequency.

8. A phase locked loop frequency synthesizer circuit of claim 7, wherein the compensation voltage is the voltage difference between the two different voltages generated by integrating current for different clock cycle time intervals.

9. A phase locked loop frequency further synthesizer circuit of claim 5, wherein the spurious compensation circuit further comprises:

a capacitor and analog switch array;

a pair of analog switches connected to one node of a second capacitor and apply one of two voltage to the capacitor node;

another node of the capacitor being connected to the charge pump output;

wherein changing a state of the analog switch, generates a charge on the capacitor according to the formula:

$$N*C*(\text{delta-}V)$$

wherein C is the capacitance value;

(delta-V) is voltage difference of two nodes to which analog switches are connected;

N is a number of capacitors on which the applied voltage is changes.

10. A phase locked loop frequency synthesizer circuit of claim 9, wherein the compensation voltage generation circuit further comprises, a variable reference capacitor composed of MOS analog switches and capacitors that have same temperature and variation characteristics with the capacitor;

an analog switch to precharge to the variable reference capacitor;

an analog switch coupled between the variable reference capacitor and the charge pump circuit node wherein the compensation voltage is generated by integrating the charge pump output current through the analog switch and the variable capacitor for a cycle time of the prescaler output clock or reference clock, the ratio of the variable capacitor value in the compensation voltage generation circuit to the capacitor value in the spurious compensation circuit being determined by the divider number value in prescaler or the frequency ratio of the VCO output frequency to the reference clock signal frequency.

* * * * *